United States Patent [19]
Kilian et al.

[11] 4,439,739
[45] Mar. 27, 1984

[54] CIRCUIT ARRANGEMENT WITH ELECTRONICALLY CONTROLLABLE TRANSFER CHARACTERISTIC

[75] Inventors: Ernst A. Kilian; Wilhelm Graffenberger, both of Hamburg, Fed. Rep. of Germany; Eise C. Dijkmans, Eindhoven; Rudy J. van de Plassche, Waalre, both of Netherlands

[73] Assignee: U.S. Philips Corporation, New York, N.Y.

[21] Appl. No.: 320,376

[22] Filed: Nov. 12, 1981

[30] Foreign Application Priority Data

Aug. 17, 1981 [DE] Fed. Rep. of Germany ....... 3132402

[51] Int. Cl.³ .............................................. H03G 5/04
[52] U.S. Cl. .................................... 330/107; 330/86; 330/282; 330/294; 330/304; 333/28 T
[58] Field of Search ................... 330/51, 86, 107, 282, 330/294, 304; 333/28 T; 179/1 D

[56] References Cited

U.S. PATENT DOCUMENTS

| 3,500,316 | 3/1970 | Brown | 330/86 |
| 4,099,134 | 7/1978 | Schroder | 330/86 X |
| 4,363,001 | 12/1982 | Suzuki et al. | 333/28 T |

*Primary Examiner*—James B. Mullins
*Attorney, Agent or Firm*—Robert T. Mayer, Bernard Franzblau

[57] ABSTRACT

A low-noise bass-control device, which is digitally controllable in a simple manner, comprises an amplifier having an output connected to the series arrangement of a capacitor and a tapped resistor chain. The taps on said resistor chain are connected to an inverting input of the amplifier via a first switch and to the output of the control device via a second switch.

8 Claims, 10 Drawing Figures

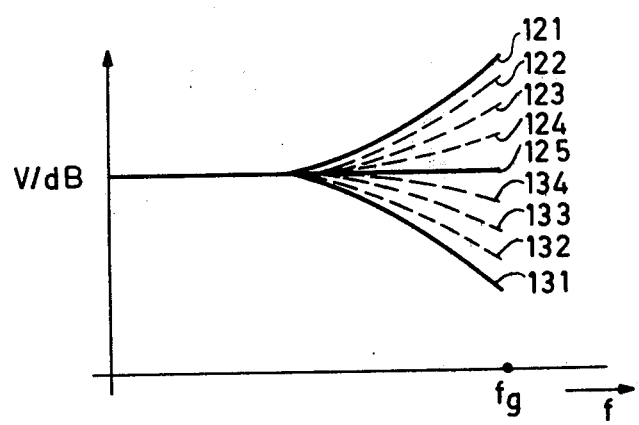
FIG.2
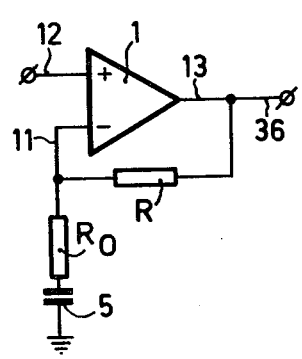 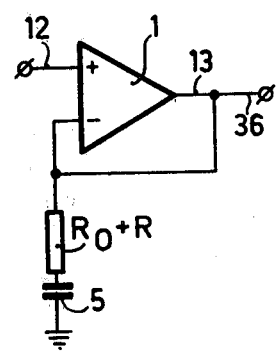 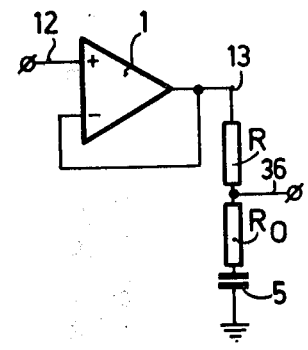
FIG.3a  FIG.3b  FIG.3c

CIRCUIT ARRANGEMENT WITH ELECTRONICALLY CONTROLLABLE TRANSFER CHARACTERISTIC

BACKGROUND OF THE INVENTION

This invention relates to a bass-control arrangement with an electronically controllable transfer characteristic and with the input signal applied to an amplifier having controllable negative feedback.

Such a circuit arrangement is known from DE-PS No. 24 04 331 and DE-PS No. 22 62 089. The negative feedback of the amplifier, and consequently the transfer characteristic of the circuit arrangement, is varied in that the current distribution between two differential amplifiers is varied in an opposite sense by means of a direct voltage. The inputs of the two differential amplifiers are coupled to each other either via a frequency-independent network so that a volume control device is obtained (DE-PS No. 24 04 331), or via a frequency-dependent network (DE-PS No. 22 62 089), so that a tone control device (treble or bass control) is obtained.

A disadvantage of circuit arrangements which are based on the variation of the current distribution between two differential amplifiers is that they exhibit a comparatively large amount of noise. Moreover, if such a circuit arrangement is constructed as an integrated circuit at least three external connection terminals must be provided for connection of the negative feedback network and the external connections to such an integrated circuit are comparatively intricate, at least when said circuit is used as a tone control device.

SUMMARY OF THE INVENTION

It is an object of the present invention to design a bass-control arrangement of the type mentioned in the opening paragraph in such a way that the transfer characteristic can be controlled electronically without the use of current distribution circuits of the type mentioned above.

According to the invention this object is achieved in that a frequency-dependent voltage divider circuit having a plurality of taps is connected to the output of the amplifier and in that the taps are connected to an inverting input of the amplifier via a first electronically controllable switch and to the output of the circuit arrangement via a second electronically controllable switch, the frequency-dependent voltage divider being designed so that the signal voltage on at least some of the taps decreases as the frequency decreases.

The signal voltage on each tap of the voltage divider circuit has a different value. If the first switch is connected to a tap carrying a comparatively high signal voltage, the negative feedback will be comparatively strong and the gain will consequently be comparatively low. However, if the second switch is connected to such a tap, the gain will be comparatively high. The situation is exactly reversed when the switch is connected to a tap carrying a comparatively low voltage.

In an embodiment of this circuit arrangement a resistor chain comprising a plurality of taps is connected to the amplifier output and a capacitor is arranged between the amplifier output and one of the taps. If the amplifier, the switches and the resistor chain are again constructed in an integrated form only one external component is required, the capacitor. For the connection of this capacitor the integrated circuit should comprise two connections.

In a further embodiment of such a bass control device the terminal of the resistor chain which is remote from the amplifier output is connected to a reference point (ground) via a capacitor and the impedance of the capacitor is low relative to the impedance of the resistor chain. The capacitor in series with the resistor chain is suitably an electrolytic capacitor and serves to make the d.c. impedance between the tap and the reference point (for example, ground) so high that the d.c. negative feedback is strong and the d.c. gain is unity. This minimizes offset voltages at the amplifier output, which voltages, as is known, increase as the d.c. gain increases.

In a further embodiment of the invention the two switches are controlled in such a way that one of the two switches always conveys the full output voltage of the amplifier. If, for example, the resistor chain comprises n divider resistors and each of the two switches has n inputs, with one input at any time being connected to its output, this yields $n^2$ combinations of switch positions, some of which are redundant, because, for example, a treble reduction is fully or partly compensated for by a treble boost. Owing to the steps in accordance with this embodiment the entire treble (bass) control range requires only $2(n-1)$ switch positions.

In this respect it is to be noted that from the magazine "Funkschau" 1980, Vol. 5, a circuit arrangement is known for influencing audio signals in which the semiconductor switches are actuated by digital signals. However, the known circuit arrangement which serves as a volume control device, is comparatively expensive, because it requires the use of an analog-to-digital converter with a resolution of 17 bits.

BRIEF DESCRIPTION OF THE DRAWING

The invention will now be described in more detail with reference to the drawings. In the drawings:

FIG. 2 represents the frequency response for various positions of the two switches in the arrangement of FIG. 1, FIGS. 3a to 3c represent equivalent diagrams of the circuit arrangement of FIG. 1 for various switch positions.

DESCRIPTION OF THE PREFERRED EMBODIMENT

Figure 1:
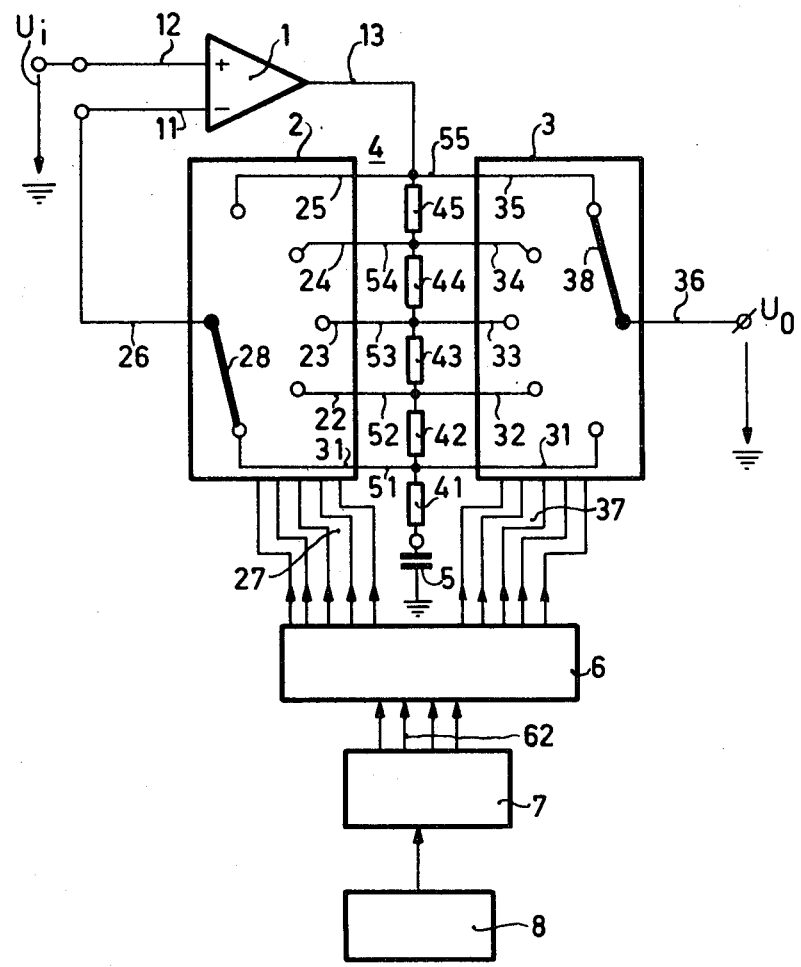
FIG. 1 is a circuit diagram of a circuit arrangement which functions as a treble control device.

FIG. 1 shows a circuit arrangement which may be used as a treble control device in an audio amplifier to which a loudspeaker is connected. The loudspeaker serves for the reproduction of audio signals supplied by a radio tuner, a record player or the like. The circuit arrangement comprises an operational amplifier 1 with an open-loop gain of 80 dB having a non-inverting input 12 that receives the input signal $u_i$. The output terminal 13 of the amplifier is connected to a capacitor 5 via a resistor chain 4 comprising five series-connected resistors 41–45, the other end of said capacitor being connected to ground. The output 13 of the amplifier and the four junction points between the resistors 41–45 are provided with five taps 55–51, which are connected to the five input terminals 25–21 and 35–31 respectively of two switches 2 and 3. Depending on the positions of said switches, which are symbolically represented by a switch arm 28 and 38 respectively, one of the control inputs 21–25 or 31–35 is connected to the respective output terminal 26 or 36 of the relevant switch 2 or 3. Which input is connected to the output 26 or 36 is determined by a digital data word applied to the five control inputs 27 or 37 of the respective switches 2 and 3.

The output 26 of the switch 2 is connected to the inverting input 11 of the amplifier 1, while the output 36 of the switch 3 constitutes the output of the circuit arrangement, on which output the output signal $u_0$ is available. The higher frequencies are then influenced in different ways depending on the switch positions of the switches 2 and 3.

In the switch position shown, in which the output of the circuit arrangement is connected directly to the output of the amplifier via the switch 3 and in which the output 26 is connected to the tap 51 at the lower end of the resistor chain, the equivalent diagram of FIG. 3 is valid. The resistance R between the output of the amplifier and its inverting input corresponds to the sum of the values of the divider resistors 42–45 of the resistor chain 4, while the resistance $R_0$, which is low in comparison with R and which serves to limit the treble boost or reduction, corresponds to the value of the resistor 41 and, in series with the capacitor 5, is included between the inverting input 11 and ground. At comparatively low frequencies the impedance of the capacitor 5 is high in comparison with the impedance of the resistance R, so that the signal at the inverting input 11 substantially corresponds to the signal at the output of the amplifier 1. In this case a voltage gain of 1 or 0 dB is obtained. At higher frequencies the impedance of the capacitor 5 may no longer be ignored in comparison with the resistance R, so that the negative feedback decreases, which corresponds to an increase of the gain at higher frequencies (treble boost). Thus, the gain as a function of the frequency will vary as represented by the uninterrupted line 121 in FIG. 2.

If, with the same position of the switch 3, the position of the switch 2 is changed so that the inputs 22, 23, 24 and 25 are consecutively connected to the output 26 of the switch 2, the resistance $R_0$ will increase stepwise, whereas the resistance R will decrease by the same amount. Thus, at the higher frequencies the negative feedback will increase continually that is, the boost at the higher frequencies will be reduced continually, as is represented by the broken lines 122–124. If finally the input 25 of the switch 2, which input is connected to the output 13 of the amplifier 1, is connected to the switch output 26, the equivalent diagram shown in FIG. 3b is valid. The resistance $R_0 + R$ then corresponds to the sum of the values of the resistors 41–45. The full output voltage is then always fed back to the amplifier input so that the resulting characteristics (continuous line 125) is perfectly linear if the internal resistance of the amplifier is substantially smaller than the impedance existing at the output.

If, in contradistinction to the switch position shown in FIG. 1, the input 25 of the switch 2 is connected to its output 26 and the input 31 of the switch 3 to the output 36, the equivalent diagram of FIG. 3c is valid, the resistance R again corresponding to the sum of the values of the resistors 42–45 and the resistance $R_0$ corresponding to the value of the resistor 41. Since, as already stated, the impedance of the capacitor 5 at low frequencies is high in comparison with the resistance R, the output signal of the amplifier 13 appears substantially unchanged at the output terminal 36 of the circuit arrangement. At higher frequencies, however, the resistance R is no longer negligible in comparison with the impedance of the capacitor 5, so that the gain decreases towards the higher frequencies, as represented by the uninterrupted line 131 in FIG. 2. The resistance $R_0$, which corresponds to the divider resistor 41 of the resistor chain 4, then prevents an excessive reduction of the gain at high frequencies. If the switch 3 is now changed over, so that consecutively the inputs 32, 33, 34 are connected to the output 36 of the switch 3 (the input 25 of the switch 2 remaining connected to its output 26), the resistance $R_0$ in the equivalent diagram of FIG. 3c increases continuously, while the resistance R is reduced, so that the gain reduction at higher frequencies decreases continuously, as is represented by the broken lines 132–134 in FIG. 2. In the upper position of the switch 3 the equivalent diagram of FIG. 3b and the frequency-independence of the gain as represented by the line 125 are obtained again.

In addition to the switch positions described, other positions are possible. For example, the inputs 23 and 33, to which the tap 53 is connected, may be connected to the outputs 26 and 36 of the respective switches 2 and 3, but the treble reduction and treble boost then exactly compensate for each other so that again a linear frequency response is obtained. In other switch positions only a partial compensation is obtained, so that either a treble boost or treble reduction is obtained, but the variation of the frequency response still varies beween the limits 121 and 131, so that these switch positions are superfluous When the divider resistors 41–45 and the capacitor 5 are suitably dimensioned, it is possible to make the gain for an upper limit frequency $f_g$, for example at 20 kHz, vary by, for example, 3 dB between adjacent characteristics shown in FIG. 2. For the specified gain variation steps of 3 dB, overall treble boosts or reductions of ±12 dB can be obtained with the circuit arrangement of FIG. 1. If even greater boosts or reductions are required without the gain variations being increased, or if the gain variation between adjacent characteristics may be smaller than 3 dB, a resistor chain with even more divider resistors should be employed.

As already stated, the switches 2 and 3 are changed over by digital data words on their respective inputs 27 and 37. Such switches are known, for example in the form of the integrated circuit Philips TDA 1029, which, however, is designed for switching over from four inputs to two outputs. A greater number of switching possibilities is obtained by cascading, as is for example described in the Magazine "Technische Informationen für die Industrie" No. 780530 (FIG. 23) published by Valvo. The two 5-bit data words required for controlling the switches 2 and 3 are supplied by a code converter circuit 6, which converts a four-bit data word appearing at its input 62 into a ten-bit data word, of which five bits are each applied to the control inputs 27 and 37 of the switches 2 and 3. The code converter circuit may comprise a memory having a number of ten-bit storage locations corresponding to the number of possible switch positions (nine), which locations are addressed by the signal on the input line 62. It may alternatively comprise a logic circuit comprising gates, which circuit produces a ten-bit data word on the output for each four-bit data word on the input.

The inputs 62 of the code converter circuit 6 are connected to the output of a memory 7 whose content determines the position of the switches 2 and 3. The memory 7 may for example be an up-down counter which can count to nine and whose counting direction can be controlled by the user via the unit 8, consecutive counts being assigned to the switch positions which correspond to adjacent chacteristics, for example the characteristics 133 and 134 in FIG. 2, so that during a count-up (down) cycle the characteristics 121 to 131 (FIG. 2) are covered quasi-continuously in the one or the other direction.

However, the memory 7 may also be controlled by a microprocessor. If said microprocessor serially supplies the four bits of a data word, a shift register is required into which the data supplied by the microprocessor is loaded, which data is then transferred in parallel to the memory 7.

The circuit arrangement described produces a smaller amount of noise than the known circuit arrangements because the operation of both the amplifier and the switches 2 and 3 is not based on the current distribution principle. The treble boost and reduction curves are exactly mirror-inverted relative to each other because for both functions the same resistor chain and the same capacitor are used. If the circuit arrangement shown in FIG. 1 is manufactured as an integrated circuit, all the elements shown, except for the capacitor 5, can be integrated on one chip. Thus, only one external circuit element (the capacitor 5) must be connected to such an integrated circuit and for this purpose only one external connection (pin) is needed.

For frequencies above the limit frequency $f_g$ in FIG. 2 which are so high that the impedance of the capacitor 5 is low in comparison with the resistance $R_0$ and for frequencies higher than the first-mentioned frequencies the transfer characteristic is again a linear function of the frequency for a specific switch position, but it is situated at different levels for different switch positions. If the capacitance of the capacitor 5 is now made so high that the "higher" frequencies, for which the gain is frequency-dependent for a specific switch position, are situated beyond the range of audibility, the circuit arrangement shown in FIG. 1 will function as a volume-control device. Suitably, if the switch 2 is in such a switch position, the inverting input 11 of the amplifier then remains connected to the tap 55 or the output 13 of the amplifier 1, because in that case the negative feedback is a maximum and the distortion is minimal. Then, only the second switch 3 needs to be controlled for adjusting the volume. —If the gain variation steps for different switch positions should be further reduced, a further resistor having a value higher than the resistor 41 may be arranged in series with said last-mentioned resistor.

Figure 4:
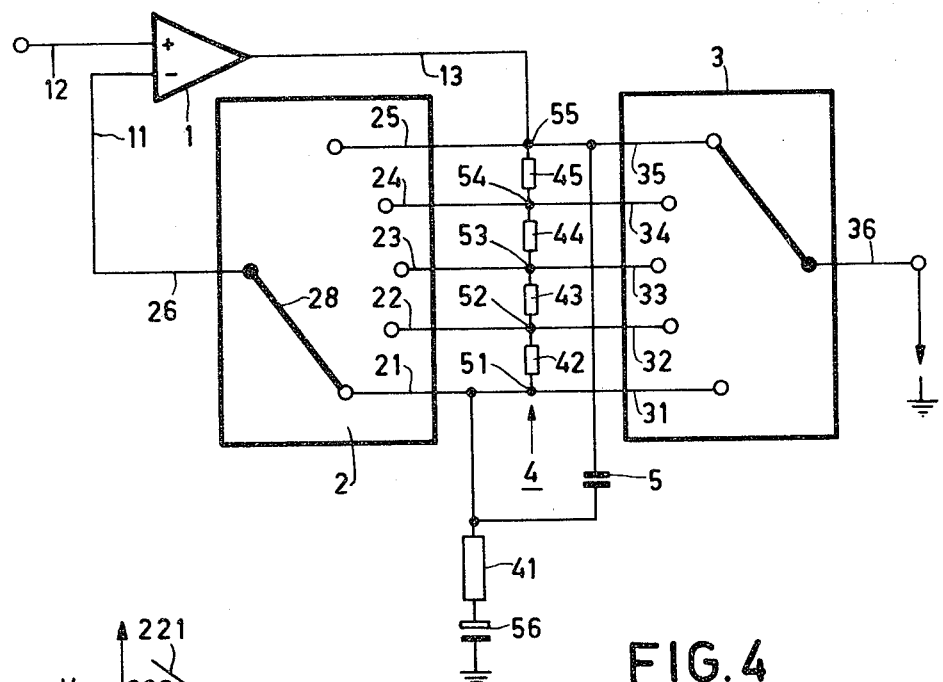
FIG. 4 is a circuit diagram of a bass control device in accordance with the invention.

FIG. 4 represents a so-called bass-control device, that is, a circuit arrangement by means of which the lower frequencies can be boosted or attenuated at option. The circuit design of the circuit arrangement of FIG. 4, which arrangement can be controlled by the control units 6, 7, 8 in the same way as the circuit arrangement of FIG. 1, differs from the last-mentioned circuit arrangement only in that the capacitor 5 between the output 13 of the amplifier 1, which output corresponds to the tap 55, and the tap 51 is arranged between the two lower resistors 42 and 41 of the resistor chain, and in that the terminal of the lower resistor 41 of the resistor chain 4 which is remote from the output 13 of the amplifier 1 is connected to earth via a capacitor 56 with a very high capacitance, suitably an electrolytic capacitor. The function of the last-mentioned capacitor is to reduce the d.c. gain of the amplifier 1 to unity so that the offset voltages at the output become comparatively small. Said capacitor 56 may be dispensed with if the terminal of the resistor 41 which is connected to said capacitor is d.c. coupled to the point to which the input 12 of the amplifier 1 is connected.

Figure 5:
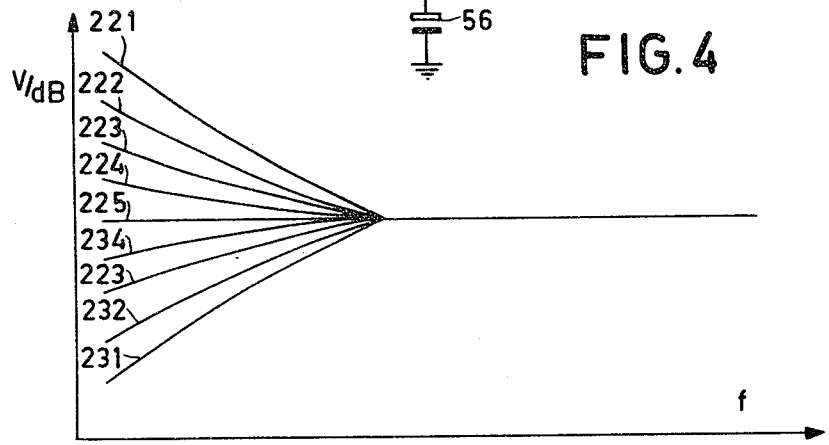
FIG. 5 represents the frequency response of the circuit arrrangement of FIG. 4 for various positions of the two switches.
Figure 6A:
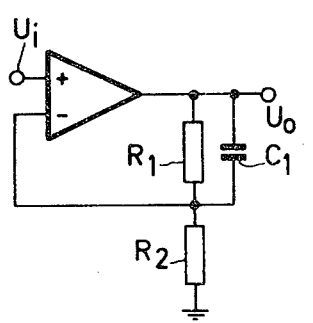
FIGS. 6a to 6c represent equivalent diagrams of the circuit arrangement of FIG. 4 for various switch positions.
Figure 6B:
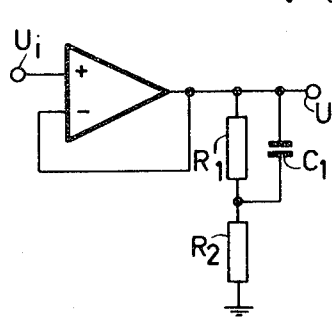

In the switch position of the switches 2 and 3 as shown in FIG. 4 the equivalent diagram of FIG. 6a is valid for the circuit arrangement, $R_1$ representing the series arrangement of the resistors 42 to 45, the capacitor $C_1$ corresponding to the capacitor 5, and the resistor $R_2$ corresponding to the resistor 41 (for all the frequencies to be transmitted the impedance of the capacitor 56 is negligible relative to the other resistances). For the lower frequencies of the transmission range the impedance of the capacitor $C_1$ is not yet negligible relative to that of the resistor $R_2$, so that the negative feedback increases and the gain decreases at increasing frequency, until at the mid-range frequencies the capacitor $C_1$, in comparison with the resistor $R_2$, substantially presents a short-circuit to the signal, as a result of which the gain assumes the value 1, as is represented by the gain curve 221 in FIG. 1. If the switch arm 28 is set to the upper position and one of the taps 52-54 is connected to the inverting input 11 of the amplifier 1, the extent to which the low frequencies (bass tones) are boosted decreases continually, as is represented by the gain curves 224 in FIG. 5. If finally the tap 55 of the resistor chain 4, or the output 13 of the amplifier 1, is connected to the inverting input 11 of the amplifier via the switch 2, the equivalent diagram of FIG. 6b will be valid. In this switch position the resistor chain and the capacitor function as a frequency-dependent load on the amplifier output, but its negative feedback is frequency-independent, so that the gain also becomes freuency-independent if the output resistance of said amplifier is low in comparison with the impedance acting on its output. The gain then varies as a linear function of the frequency, as is represented by 225.

Figure 6C:
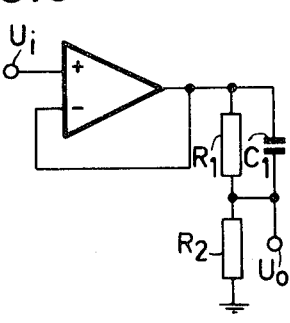

If the switch position of the switches 2 and 3 is changed in such a way that the inverting input 11 is connected to the tap 55 and the output to the tap 51, the equivalent diagram shown in FIG. 6c is obtained. The output voltage of the amplifier is then divided by the voltage divider comprising the elements $R_1$, $C_1$ and $R_2$, the transfer coefficient or the gain then being reduced at decreasing frequency. This results in the gain curve 231. If the switch 3 is connected to the taps 52, 53 or 54 instead of to the tap 51, the gain characteristics 232-234 are obtained.

For the bass-control device shown in FIG. 4 and the treble control device shown in FIG. 1 the distortion and noise are reduced substantially in comparison with the known electronically controllable treble and bass-control devices. The bass-boost and reduction curves 221-231 are then again strictly mirror-inverted relative to each other because the same components are utilized by both functions.

What is claimed is:

1. A bass-control circuit arrangement having an electronically controllable frequency transfer characteristic comprising, an amplifier having an inverting input and a non-inverting input and a controllable frequency-dependent negative feedback, a signal input terminal coupled to the non-inverting input of the amplifier, a signal output terminal, a frequency-dependent voltage divider including a resistor chain having a plurality of taps, means connecting said voltage divider to an output of the amplifier, a capacitor coupled between the amplifier output and a tap on the resistor chain, a first electronically controllable switch for selectively coupling said taps on the resistor chain to the inverting input of the amplifier, and a second electronically controllable switch for selectively coupling the taps on the resistor chain to the signal output terminal independently of the setting of the first switch, the resistor chain and capacitor being designed so that a signal voltage on at least some of the taps decreases as the signal frequency decreases.

2. A bass-control arrangement as claimed in claim 1 further comprising a second capacitor coupled between that tap on the resistor chain which is remote from the output of the amplifier and a reference point, the impedance of the second capacitor being low relative to the impedance of the resistor chain.

3. A bass-control arrangement as claimed in claims 1 or 2 wherein the first and second switches are controlled such that one of the two switches always conveys the full output voltage of the amplifier.

4. A bass-control arrangement as claimed in claims 1 or 2 wherein each switch comprises a semiconductor circuit having a switching state controlled by means of a digital data word applied to its control input.

5. A bass-control arrangement as claimed in claim 4, further comprising a memory circuit coupled to the control inputs of the switches with the data words for the control inputs of the switches being stored in said memory circuit.

6. A bass-control arrangement as claimed in claim 1 further comprising means for controlling the first and second switches so that the switches can be simultaneously positioned to the tap on the resistor chain closest to the amplifier output thereby to produce a flat frequency transfer characteristic at the low frequency end of the signal frequency spectrum.

7. A bass-control arrangement as claimed in claim 6 wherein said switch controlling means controls the switches such that for every setting of the first and second switches the output of at least one switch is coupled to a tap on the resistor chain closest to the amplifier output.

8. A bass-control arrangement as claimed in claim 1 wherein the capacitor is directly connected between the amplifier output and that tap on the resistor chain furthest from the amplifier output and independently of the setting of at least the first switch.

* * * * *